United States Patent [19]
Christian et al.

[11] Patent Number: 6,014,508
[45] Date of Patent: Jan. 11, 2000

[54] METHOD OF ADDING CONSTRAINED CLUSTER POINTS TO INTERCONNECTION NETS IN INTEGRATED CIRCUIT CHIPS AND PACKAGES

[75] Inventors: Kenneth L. Christian, Poughkeepsie; Craig R. Selinger, Spring Valley, both of N.Y.; Hope L. Bauer, Rochester, Minn.; Hardev S. Dhaliwal; Cynthia L. Martin, both of Austin, Tex.

[73] Assignee: International Business Machines Corporation, Armonk, N.Y.

[21] Appl. No.: 08/909,112

[22] Filed: Aug. 11, 1997

[51] Int. Cl.[7] ..................................... G06F 17/50
[52] U.S. Cl. ............................ 395/500.14; 395/500.03
[58] Field of Search .................... 364/488, 489, 364/490, 491; 395/500.03, 500.14, 500.09, 500.13, 500.15

[56] References Cited

U.S. PATENT DOCUMENTS

| | | | |
|---|---|---|---|
| 5,150,308 | 9/1992 | Hooper et al. | 364/489 |
| 5,168,455 | 12/1992 | Hooper | 364/490 |
| 5,212,650 | 5/1993 | Hooper et al. | 364/489 |
| 5,566,078 | 10/1996 | Ding et al. | 364/490 |
| 5,682,321 | 10/1997 | Ding et al. | 364/490 |
| 5,729,466 | 3/1998 | Bamji | 364/488 |
| 5,757,653 | 5/1998 | Christian et al. | 364/488 |
| 5,838,585 | 11/1998 | Scepanovic et al. | 364/491 |

OTHER PUBLICATIONS

C. R. Selinger, et al, "IBM ES/9000 Buried Engineering Change Modeling For Verification" Proceedings 1992 IEEE Multi–Chip Module Conference MCMC–92, Calilfornia, Mar. 1992, pp.167–170.

Primary Examiner—Kevin J. Teska
Assistant Examiner—Leigh Marie Garbowski
Attorney, Agent, or Firm—H. Daniel Schnurmann

[57] ABSTRACT

A method of wiring a plurality of integrated circuits within a chip or between chips in one or more packages by adding cluster points to a net that includes a plurality of nodes to be interconnected. The interconnected nodes are designed to meet system requirements, commonly expressed by a set of wiring rules, include among others, physical, electrical and noise constraints. The method includes matching interconnection net attributes to wiring rule logical definitions, wherein the wiring rules include rule nodes and rule connections. The rule nodes define constraints for the pins, vias and cluster point structures. The rule connections define wiring constraints between the node structures to establish the net topology. The process described is based on net ordering and checking. The net ordering, which defines the pin-to-pin connections based on the wiring rule, is performed prior to chip or package wiring. Net ordering imposes the wiring rule added cluster points, the desired interconnection topology and the wiring constraints to the net. Checking verifies the correctness of the net attributes when the design wiring is complete.

20 Claims, 6 Drawing Sheets

ORIGINAL NET WITH LOGICAL/PHYSICAL DEFINITION:

FIG. 1A
PRIOR ART

DESIRED NET RESULT DEFINITION:

○ - NODE Statement

▭ - CONN Statement

RULE Name = CLUSTER_RULE;

| | | | |
|---|---|---|---|
| NODE A | Type = P | IO = OUT; | // Driver |
| NODE B | Type = T; | | // Added Cluster Point |
| NODE C | Type = P | IO = IN; | // One of Three Receivers |
| NODE D | Type = P | IO = IN; | // Second of Three Receivers |
| NODE E | Type = P | IO = IN; | // Third of Three Receivers |

CONN A B  Min_Length = Jmin   Max_Length = Jmax;
CONN B C  Min_Length = Kmin   Max_Length = Kmax;
CONN B D  Min_Length = Kmin   Max_Length = Kmax;
CONN B E  Min_Length = Kmin   Max_Length = Kmax;

FIG. 3

```
EXAMPLE OF A TWO RECEIVER AND WIRING RULE

NET                          WIRING RULE

Net Name = ADDR_1            RULE Address;
Node = 1, Driver             NET ADDR* ;
Node = 2, Receiver           NODE A   Type = P    IO = Driver ;
Node = 3, Receiver           NODE B   Type = T ;
                             NODE C   Type = P    IO = Receiver ;
                             NODE D   Type = P    IO = Receiver ;
                             CONN A B  minlen = 18    maxlen = 20 ;
                             CONN B C  minlen = 2.5   maxlen = 3 ;
                             CONN B D  minlen = 2.5   maxlen = 3 ;
```

METHOD OF ADDING CONSTRAINED CLUSTER POINTS TO INTERCONNECTION NETS IN INTEGRATED CIRCUIT CHIPS AND PACKAGES

FIELD OF THE INVENTION

This invention relates generally to a method of wiring integrated circuit chips, multi-chip-modules, cards and the like and, more particularly, to a method of adding constrained cluster points to interconnected nets, wherein the constraints are based on electrical, timing and noise specifications.

BACKGROUND OF THE INVENTION

In modern high speed computer and communication package design, the wiring between electronic circuits must adhere to strict electrical, timing and noise constraints in order for the design to function reliably to specification. Practitioners of the art will readily appreciate that many fundamental concepts of how these constraints are defined and applied vary substantially by package level. It will be demonstrated that this variation is only coincidental to the package level, and is in reality based on the correlation between the driver rise time, wiring propagation delay, and system noise characteristics. In the case of a computer chip design, line lengths are relatively short with respect to the system cycle time and the driver rise time. This makes it possible to make a critically simplifying approximation of capacitance loading. One can thus constrain net capacitance, and use this constrained capacitance value to easily determine time delay characteristics and, thus, system timing. For other types of packages, particularly, for those having longer line lengths, such as modules, cards, board, frame cables, and the like, most of the line lengths are normally far too long to be considered as a simple capacitance loads. Furthermore, timing and electrical net properties must also be taken into account by performing transmission line analysis.

A rule of thumb for determining if and when the concept of capacitive equivalence simplification can be applied is that when the propagation delay time (i.e., the time of flight) of the wire, namely, how fast electrons speed down the wire, is less then one-eighth the driver rise time of the electrical circuit for a given wire length, then the wire can be capacitively modeled. The maximum wire length for which a capacitive model can be used is given by the following equation:

$$\text{Max length} = \tfrac{1}{8} * \text{driver\_rise\_time} * \text{wire\_time\_of\_flight},$$

wherein the units are:

[length]=constant*[time]*[length]/[time]

The argument made herein is that the method of the present invention does not gravitate around a well defined concept that merely extends from a chip to a higher level package. In fact, if those other packages had wire lengths sufficiently short to apply the concept of capacitive approximation, then there would be no need for the present invention. Furthermore, as chips become large enough that some or all of their nets can no longer be capacitively modeled, then the present invention applies to chips as well. Furthermore, as faster circuits are developed, driver rise times will correspondingly decrease, further reducing wire lengths. Similarly, as 'faster' wires (e.g., cryogenic wires) are developed, the time of flight will likewise decrease, thus reducing the maximum wire length for the application of capacitive equivalence modeling.

In the model of the present invention, electrical constraints are typically specified by an electrical design engineer and are developed based on the system timing considerations and reliability requirements, without using the concept of lump capacitive modeling. These constraints are developed for use in applications based on the presence of various types of drivers, receivers, terminators, I/O connectors, and combinations thereof, as well as different interconnection configurations. In typical cases, as many as 1000 different unique constraint types may exist just on a chip, and many more, on higher level packages.

An electrical interconnection analysis not only involves careful evaluation of the all interconnected chip circuit technologies for compatible switching levels and function, but it must consider the effects of transmission line loading on the circuits. The fast edge switching rates of circuits require extensive analysis for accurate propagation delay prediction between circuits. This analysis that controls the inner connection delay involves meeting the design electrical noise margins in terms of chip I/O and package wiring contributions of signal reflections, edge rounding, undershoot, overshoot, incident switching and settling times. These requirements are compounded by the need to develop systems at the least expense. In prior art systems, many more book types (i.e., predefined macros that reside in a technology library and which are available by designers to be used as building blocks) exist for maximum system design optimization without incurring in the overly high cost associated with the system development.

The analysis of the interconnection networks found in real hardware designs requires extensive analysis, in addition to a substantial amount of engineering judgment. Thus, from a computational point of view, it is cost prohibitive to perform real time detailed net design analysis during the package design process. It is also logistically impossible to draw upon the required engineering judgement during the package design process, which is mostly automated. The only exception is for designs with such large design margins that the computational complexity, and correspondingly, the accuracy requirements are, correspondingly, very low.

A different methodology is required for complex designs which characteristically have small design margins, to practically insure valid designs, including the required engineering judgment, without impacting the processing time. In this latter case, the use of wiring rules may advantageously be chosen, particularly since rules are developed to define valid networks in the design, to drive the wire router in interconnecting circuits, and to check the design as a design release criteria. These wiring rules historically translate engineering electrical specifications into specific entities, such as book types, node capacitance, impedance loading, minimum or maximum length restrictions, and net topology.

Net topology defines how nodes in a network are to be interconnected. Often, the topology is defined as a daisy-chain, which links each node of the net one after another. Another type of topology includes cluster nets having a common node fanning out to other nodes of the net. Electrically, the timing or propagation delay characteristics of these two net types differ from one another. Oftentimes, nets are defined as combinations of the two, with very rigid length and book type specifications at each node.

Historically, complex net types have been defined and modeled that were so multifarious that they could not be automatically routed (by an automatic tool) within the definition of the intricate constraints set out for them. These complex net types could include one or more cluster points, either at a pin, or at some internal arbitrary position within the chip, (i.e., not at any predefined node or via point), or required at some internal within the chip or package. Those nets generally contained constraints for load balancing between branching segments for length, and/or capacitance. The result was that most of these nets, often hundreds in a given design, which could not be ordered legally, were left as overflows, and subsequently had to be manually imbedded. This manual imbedding was a lengthy and tedious process highly prone to errors, and costly to correct when found later on in the development process.

Some of the above mentioned problems and proposed solutions may be found in several publications, such as in an article entitled "IBM ES/9000 Buried Engineering Change Modeling for Verification", by C. Selinger and C. Vakirtzis, IEEE Multi-Chip Module Conference, Santa Cruz, Calif., 1992. Therein is described a method for modeling certain types of connections which could be analyzed by known analytical techniques. The process employed "mushy modeling methods" (MMM) that allows treating a T junction as a straight wire with a capacitance hanging off it. The applicability of this approach was limited to cases allowing the wiring branch to be treated as a capacitance having a tightly constrained maximum length limit, usually of the order of 8 to 10 mm. Thus, although this method was useful to, e.g., ES/9000 engineering change nets, it provided a support that used MMM, which was not very accurate, and which was restricted by the limits in length of the model that was utilized.

Much time and cost has been spent on imbedding wiring for nets which require cluster points. This is not limited to only cluster points at a pin, but, specifically, also includes cluster points that are placed at any arbitrary point in space, even those not found at a pre-existing via site. The challenge here is to provide full undiminished electrical verification, noise immunity and timing analysis with no degradation in accuracy. Current state of the art tools do not support the concept of adding constrained cluster point(s) based on transmission line characteristics. The lack of a process or methodology to address this shortcoming of previous knowledge can be costly. One of the reasons why this requirement could not be supported previously is because the logic design does not include a representation of the cluster node in the net list. Therefore, adding cluster nodes had been done manually. Additionally, critical requirements were placed on each of the fan-out wiring lengths to or from the cluster points, which required manual implementation. Since all of the work had to be done manually, it was human error prone, and the cost of finding and fixing these errors was substantial. Furthermore, if the net needed an engineering change, it likewise had to be performed fully manually, since this not was not initially automatically wired.

The present invention provides a method for adding a cluster point or points to any nets in the design of a net type where allowed. The wiring rules usage is expanded to define the added cluster node, and the design is annotated with its position logically in the net topology. Constraints are added for use in routing the net as well as constraints imposed for electrical or timing requirements/limits in the network. This facilitates the ability to legally route all of the wires of this type without overflows, which was not possible previously. Nets of this type, with added cluster points at arbitrary positions can now be imbedded fully automatically. Additionally, the resulting process is well controlled by the specification of the detailed wiring rule, repeatable by applying the same or modified wiring rule to the same or another chip or package, efficient by allowing the router to imbed all wires and verifiable by wiring rule checking methods after wiring.

Prior art solutions to the aforementioned problem have the disadvantage in that they typically support only the shortest of all the nets, since existing concepts require a capacitive lumping of nets or a completely manual process. Furthermore, it is well known in the art that long segments exhibit transmission line characteristics. These segments cannot be capacitively modeled. Transmission line nets must consider reflections and nodal impedance changes, termination reflections, induced signals from surrounding nets, effects of multiple driver switching in a given time slice, and other numerous considerations that cannot be easily or accurately approximated with the capacitance approximation methods that are known today.

OBJECTS OF THE INVENTION

Accordingly, it is a primary object of the present invention to provide a design automation system that supports nets of any type, particularly, nets contained within a chip or contained within higher level packages, and not limited by capacitive drop-off modeling approximations.

It is another object of the invention to efficiently route the critical nets in a design that requires specifying router constraints to n extent cluster points without applying stringent topology and wire length constraints.

It is still another object of the invention to provide a method for supporting the arbitrary real-time addition and constraint setting for new cluster points within the nets of the design.

It is a more particular object of the invention to treat an n extent cluster points net as a singular configuration wiring, and have the net modeled without imposing overly constraining length restrictions or any capacitive equivalent segment lengths.

It is a further object of the invention to have the router flag design rule errors during the physical design phase to reduce the duration of the physical design process.

It is yet another object of the invention to have n extent cluster points constraint automatically routed with an auto router, to simplify and reduce the cost of wiring high performance cards.

SUMMARY OF THE INVENTION

In accordance to a first aspect of the invention there is provided a method of wiring a plurality of integrated circuits within a chip or between chips in one or more packages by adding cluster points to a net comprising a plurality of nodes to be interconnected while ensuring that the interconnected nodes meet system requirements that include physical, electrical and noise constraints, wherein the system requirements are expressed by wiring rule, the method comprising the steps of: a) building a trace structure comprising: i) a plurality of rule nodes, each of the rule nodes comprising at least one rule node constraint; ii) a plurality of net node lists associated with the rule nodes, each of the net node lists comprising net nodes having first attributes that meet the rule node constraints; and iii) a plurality of rule connections, each of the rule connections comprising rule connection constraints to be imposed on a pair of the rule nodes; b) successively linking each of the rule nodes to each of the rule connections until all the rule nodes have been linked, thereby forming the net; and c) matching the rule connection constraints to second attributes associated with the pair of linked rules nodes, wherein: when the matching is successful, the rule connection constraints are imposed on the pair of linked rule nodes; when the matching is successful and the net node list of at least one of the pairs of the linked rule nodes is empty, at least one cluster point is added to the net; and when the matching is unsuccessful, the connection between the linked rule nodes is flagged as violating the wiring rules.

In accordance with another aspect of the invention, there is provided a system for wiring integrated circuits within a chip or between chips in one or more packages by adding cluster points to a net comprising a plurality of nodes to be interconnected while ensuring that the interconnected nodes meet system requirements that include physical, electrical and noise constraints, wherein the system requirements are expressed by wiring rules, the system comprising: a) means for building a trace structure comprising: i) a plurality of rule nodes, each of the rule nodes comprising at least one rule node constraint; ii) a plurality of net node lists associated with the rule nodes, each of the net node lists comprising net nodes having first attributes that meet the rule node constraints; and iii) a plurality of rule connections, each of the rule connections comprising rule connection constraints to be imposed on a pair of the rule nodes; b) means for successively linking each of the net rule nodes to each of the rule connections until all the rule nodes have been linked, thereby forming the net; and c) means for matching the rule connection constraints to second attributes associated with the pair of linked rule nodes, wherein: when the matching is successful, the rule connection constraints are imposed on the pair of linked net nodes; when the matching is successful and the net node list of at least one of the pairs of the linked rule nodes is empty, at least one cluster point is added to the net; and when the matching is unsuccessful, the connection between the linked rule nodes is flagged as violating wiring the rules.

BRIEF DESCRIPTION OF THE DRAWINGS

While the specification concludes with claims particularly pointing out and distinctly claiming what is regarded as the present invention, details of a preferred embodiment of the invention may be more readily ascertained from the technical description when read in conjunction with the accompanying drawings wherein:

DETAILED DESCRIPTION OF THE PREFERRED EMBODIMENT

As previously mentioned, the present invention relates to adding cluster points based on wiring rules specifications as well as developing a wiring rule node to physical node association or an ordering process which supports matching nets whose interconnection graphs have fewer nodes then those defined by wiring rule algorithms.

The ordering process adds to the net definition the wiring rule specifications of a given package, which may consist of one or a plurality of chips, cards, modules, and the like. In order to ensure that the ordering is successfully completed, the design data is augmented with added cluster nodes definitions and constraints, both of which are provided by the wiring rules. Adding cluster points to a net is particularly relevant in applications such as memory cards address busses, wherein each 64 bit bus, address lines typically fan-out to 16 loads. Oftentimes, there is a hierarchy of cluster points in which an initial cluster branches to two separate cluster points which, in turn, branch to four loads and, subsequently, yet to two additional loads. Timing and noise requirements of this type of nets specify both that the loading at each cluster level and the overall loading of the major branches of the net are equal and balanced. To manually achieve this requirement is a labor intensive task. Additionally, the result that is arrived at needs verification and, preferably, to be automatically developed by means of a suitable algorithm, to ensure that the result is correct and optimal.

The process described herein is perfectly general and sufficiently broad to fully support complex cases. This is achieved by defining the cluster point to the router and specifying the constraints as a function of location within the network.

Overview of the Process of Adding Cluster Points to a Net

Figure 1A:
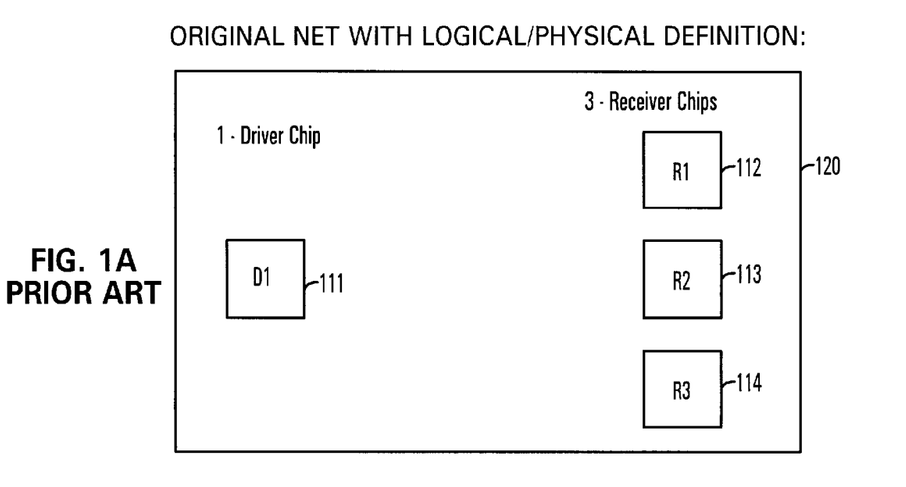
FIGS. 1a–1b is an example of a prior art 'Add Cluster' net, showing the original net with its logical/physical definition and a desired net result definition.

Referring to FIG. 1a, a net is illustrated showing an 'Add Cluster Example Net', as it is initially presented to the process of the present invention, with a set of desired resulting attributes. The original net consists of the collection of nodes (pins). Regardless of the type of package (e.g., a chip, multi-chip-module, card, board, etc.) under consideration, all the components are assumed to have been already placed and the IOs assigned, prior to the signal wire routing.

In the instant example, there is shown a card 120 consisting of four chips: a driver chip 111, and three receiver chips 112, 113, and 114. The four chips are shown in FIG. 1a without interconnections. Whereas independent wires linking chip 111 to receiver chip 112, chip 111 to 113, and chip 111 to 114, respectively, may be valid interconnections, it is evident that such a wiring configuration will violate electrical and noise requirement, such as, for instance, an excessive fan-out on driver chip 111.

The 'Add Cluster' process described herein is not limited to nets having only a limited number of pins, as shown in the example, e.g., a forty pin net.

The definition of the 'Added Cluster' is based on an electrical analysis of the package wiring and on the IO electrical characteristics that include: capacitance, differential length, propagation delay, I/O book name, as well as other electrical, as well as physical properties, such as transmission line effects, resistance loading, capacitive loading, time of flight, slew rate, response time and noise immunity, that need to be taken into consideration and which must also meet the requirements of the interconnection. Such considerations include: overshoot voltage, undershoot voltage, delay time, rise time, fall time, settling time, and noise margins. More generally stated, the net specification must meet system timing and noise requirements. In the instant example, an additional cluster node was necessary to meet the following requirements: 1) to reduce the signal reflections, and 2) balance the capacitive loading between the branches forming the net.

Figure 1B:
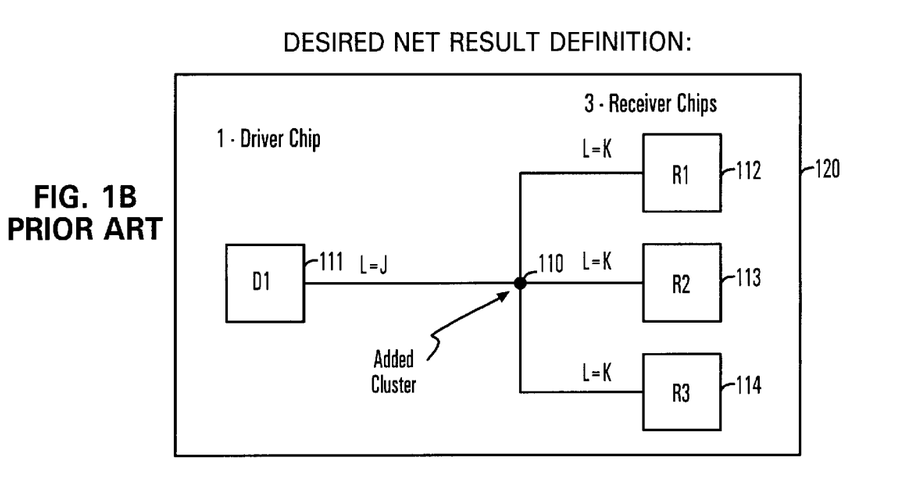

Referring to FIG. 1b, there is shown a valid wiring configuration that conforms to noise and timing requirements. Therein is shown a net as it was specified by the electrical design engineer, to which a constrained cluster point node was added. The wiring configuration depicted includes the added cluster point 110 that conforms to the wiring rules, and which is typically defined during the feasibility and the design analysis, to provide the net with an optimum wiring configuration, given the system design specifications. These specifications typically include: timing requirements, noise allowances, wireability capabilities, and circuit characteristics. The package electrical designer must take into consideration all of these specifications to achieve an optimum net configuration.

The net shown in FIG. 1b consists of pins 111, 112, 113, and 114, with their respective interconnections. This net reflects an instance of real design constraints. The three branching wires from cluster point 110 to chips 112, 113, and 114 are constrained to be of equal length. This constraint is defined by each wire as having the same length specification L=K. Whereas a length K was selected, other constraints could also be factored in, such as propagation delay or cost considerations, all of which are usually specified by a minimum and maximum value. The constraint value is arrived at through circuit simulation, electrical experience, or by applying technology groundrules. With all three branches being equal in length, a signal from driver chip 111 will propagate down the wiring of the net to cluster point 110, at which point the signal crosses all three branches (including a portion that is reflected back to the driver), propagating across three equal length wire segments and reaching each receiver chip at the same instant in time.

To facilitate communication between the electrical designer and the physical designer, a 'wiring rule' or rule format is used to define the requirements of the interconnection. The 'Add Cluster Rule Diagram' (FIG. 2) shows the rule used to convey the proper net wiring specification to the physical designer. This rule, which corresponds to the net shown in FIG. 1, defines five NODE statements and four CONN statements needed to attain the desired wired net results. NODE statements define the constraints to be matched to the node structures of the net, typically, pins, vias, test points, etc., while CONN statements define interconnection constraints between the defined NODE statements. This rule has a NODE statement not only for each of the four initially existing nodes of the net, but also for the added cluster node. The CONN statements also include the 'Added Cluster' node definition. The results of the electrical analysis and of the system design requirements are defined with the NODE and CONN statements of the rule specifying the cluster net topology and the wired length constraints between each net node. In practice, rules are not as simple as those mentioned above since other constraints are also applied to the NODE and CONN statements.

Figure 2:
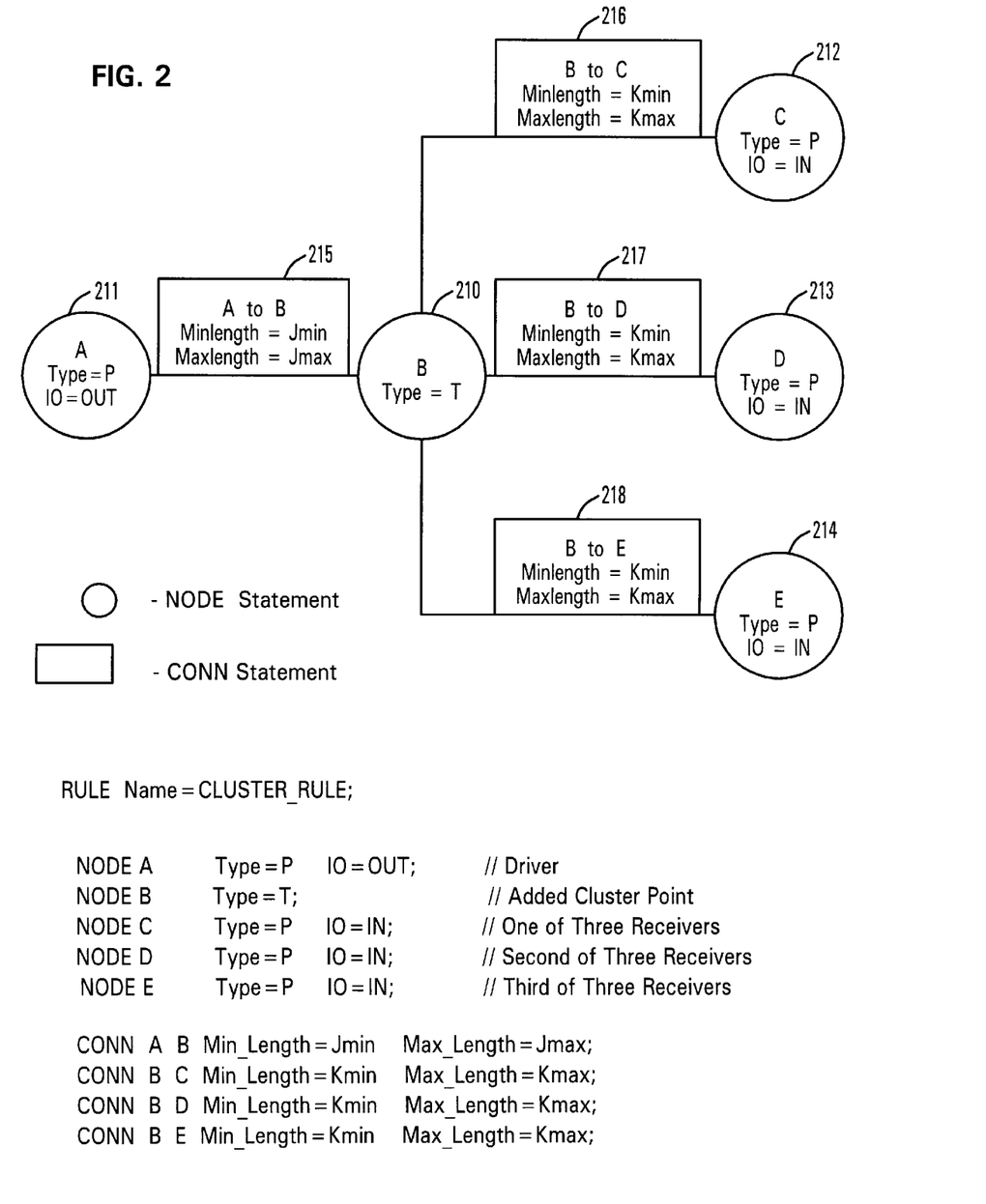
FIG. 2 is a diagram representing an 'Add Cluster' rule, as it is known in the art.

The wiring rule depicted in FIG. 2 illustrates an embodiment of the net configuration shown in FIG. 1b. Node 211 represents the driver pin of the net, while 212, 213, and 214 represent the receiver pins of the net. Node 210 is the 'Added Cluster' node. These node definitions represent generic pins and their respective constraints. Node 211 is defined as IO=OUT. Type=P specifies that this node corresponds to a net driver (or to an output pin). Nodes 212, 213, and 214 specify TYPE=P and IO=IN constraints that allow only receiver pins.

FIG. 2 further depicts CONN (i.e., connection) statements 215, 216, 217 and 218. These connection statements define how the nodes of the wiring rule are to be linked, and specify constraints for the wiring therebetween. The desired net topology is defined by 'from' and 'to' node assignments. The connections defined reflect the desired wiring lengths shown in FIG. 1b. The 'from' and 'to' node names correspondence between NODE and CONN statements define a template reflecting the desired net topology, which is easily observable in the graphic representation. Shown in the lower section of FIG. 2 is an actual coded wiring rule that reflects the identical constraints.

Figure 3:
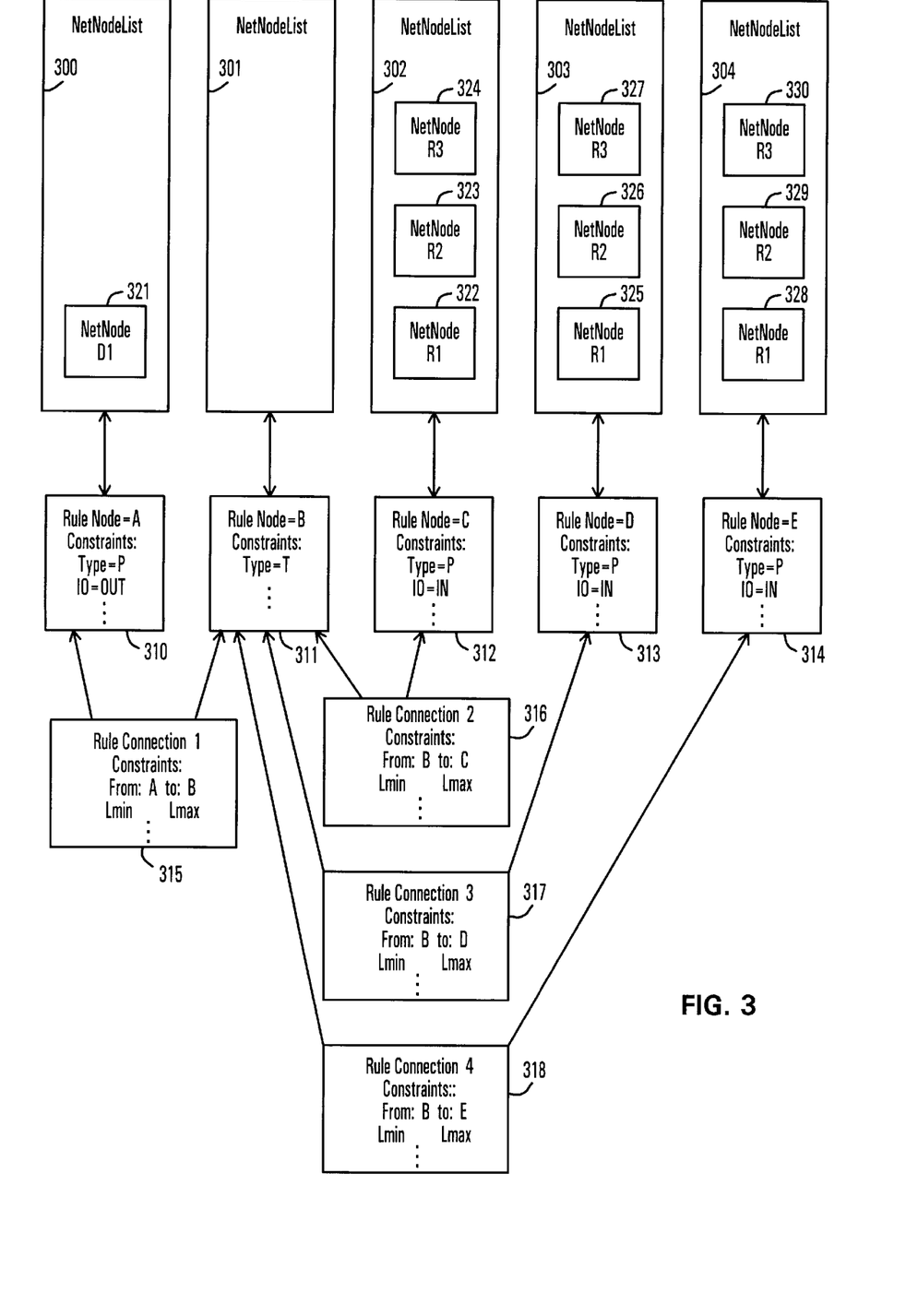
FIG. 3 is an example of a trace structure showing various sections which, in combination, describe the process of matching the net to the 'Add Cluster' wiring rule, according to the present invention.

Referring now to FIG. 3, there is shown a detailed Tracing Structure implemented (in software) to facilitate the 'Add Cluster' process. The tracing structure consists of three primary structure partitions: NetNodeLists, Rule Nodes, and Rule Connections. Each of the primary structures can be directly related to the components of FIGS. 1a–1b and 2, which in combination, tightly link the design net data to the wiring rule definition in a manner such that the net efficiently matches the wiring rule, while also adding the cluster node.

Referring jointly to FIGS. 2 and 3, the NODE statement (hereinafter also referred to as a rule node) partition is defined by the node list linking rule node structures 310, 311, 312, 313, and 314 (FIG. 3). Herein, each rule node structure is mapped to each Node statement defined in the wiring rule of FIG. 2, with the following correspondence: 310 to 210, 311 to 211, 312 to 212 and 314 to 214, respectively. These structures maintain the constraints from the wiring rule NODE statements. From each rule node structure, a NetNodeList (e.g., 300, 301, 302, 303, and 304, shown in FIG. 3) is formed.

The NetNodeList members correspond directly to the net data with each of the NetNodes 321, 322, . . . , 330 (FIG. 3), identifying pins 110, 111, 112, 113, and 114 (FIG 1b) of the net. Each NetNodeList has every pin of the net shown in FIG. 1a which meets the constraints defined by its own rule node.

By way of example, rule node 310 has a single NetNode 321 on its NetNodeList; node D1 (111 in FIG. 1) is the only node of the net meeting the constraints Type=P and IO=OUT defined in node statement 310. Rule node 312 has three NetNodes: 322, 323 and 324, corresponding to net nodes R1, R2 and R3 (112, 113, and 114 in FIG. 1). All three net nodes, likewise, meet the defined constraints Type=P and IO=IN. Rule node 313 and 314 are similar to 312. Rule node 311 has an empty NetNodeList 301. Initially, this net (see FIG. 1a) does not have any Type=T node. Rule node 311 then holds the position of a cluster point. The process of building the NetNodeList from each rule node establishes which net pins are candidates for mapping the defined nodes in the wiring rule and for maintaining a position for each cluster pin to be added.

Lastly, to build the trace structure, the CONN statements hereinafter also referred to as rule connection) are linked to the Node Statements (or rule nodes) in the NodeList. Each of the 'from' and 'to' node names are mapped to the node statement having the same node name. In this manner, CONN statement (or rule connection) 315 is linked across rule nodes 310 and 311; CONN statement (or rule connection) 316 is connected to rule nodes 311 and 312; 317 to 311 and 313; and 318 to 311 and 314, each being linked across the 'from' and 'to' named rule nodes. Rule connections 315, 316, 317, and 318 are linked to form an ordered list.

As it shall be detailed in the 'Add Cluster' process, the list of CONN statements represents the master list that drives the tracing and adds cluster points. The process basically proceeds from the first CONN statement 315 to the last statement 318. At each CONN statement, a systematic attempt is made to find a valid NetNode assignment which meets the CONN statement criteria. A check is made at each NetNode assignment to insure that, at any given time, no NetNode is ever assigned to more than one NODE statement. As the NetNodes are successfully assigned to each CONN statement, CONN statement control is passed on to the next CONN statement (as in 315 then 316). If CONN statements assignments fail for reasons such that no unused NetNodes are available for assignment or because they fail to meet a length constraint, the control of the ConnList is returned to the previous CONN statement (from 316 back to 315), and the next NetNode in the NetNodeList is assigned. The tracing ends when the head or the end of the ConnList is reached. A successful trace is achieved when the end of the list is reached. Alternatively, a failure is declared when the head of the list is reached.

The required length check is initially based on the relative distance between pins placed on the card for unwired packages. The most commonly used length is known as 'Manhattan distance', which is the sum of the changes in length of each of the X and Y directions. Optionally, other methods of length approximation that take advantage of drag may be used. Later on, when the card is wired, the actual wire length is used for the CONN statement wiring constraints. Additionally, when the net has been wired, cluster points are added to the net. Since the cluster points are now in the net, cluster node 110 (FIG. 1b) is included in the NetNodeList from NODE statement 302, when the trace structure is finally built. The process applicable to a wired net executes the same steps as those applicable to an unwired card. This allows providing design verification and checking functions of the finished package design.

Example of a Two Receivers Net

In order to better understand the previously defined process, a real life example is provided hereinafter on a net consisting of a driver pin and two receivers (also referred to as 'drops' or 'loads).
Wiring Rule Statements Initially, a set of wiring rule statements is described defining a particular net topology and its constraints to meet the system design specifications. Three primary statements are shown below:

RULE Identifies rule name and global values and constraints.

NODE Defines constraints for each node of the net.

CONN Defines how each node is connected to an adjacent node. Imposed the net topology and defines the constraints between nodes.

An improvement over existing techniques resides in that a RULE is allowed to define NODE statements in addition to what the logic design initially requires. The NODE statements also include cluster points which were not part of the original net. The CONN statements connected to the (cluster) NODE statements include constraint values, e.g., minimum and maximum wire lengths between nodes, that force the router ensure that the added node is electronically placed in a correct position.

Described hereinafter are various process steps of adding a cluster point to the net.

Figure 4:
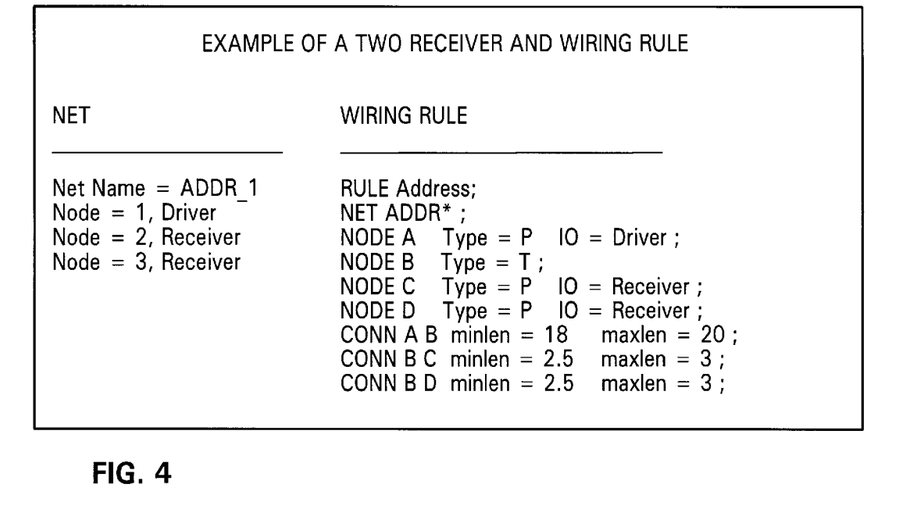
FIGS. 4–7 illustrate the process of adding a cluster point to an unordered net in accordance with the present invention.

Referring to FIG. 4, there is shown a single unordered Net Name referenced 'ADDR_1' having three Node Type (i.e., pins): a driver and two receivers. No interconnection between the nodes forming the net are yet defined. During the ordering process, to be illustrated hereinafter, interconnections to the net will be assigned by the wiring rule.

Referring to the wiring rule, the RULE Address is matched to Net ADDR_1 during the ordering process. This allows adding 'rule specific wiring constraints' to the net definition, as well as an Added Cluster node. The rule only attempts to match nets beginning with 'ADDR'. Four NODEs (i.e., A, B, C and D) are defined therein. NODE A qualifies a driver pin, NODEs C and D designates the receiver pins, and NODE B specifies a cluster point 'T' to be added by the wiring rule when matching nets.

Next, the CONN statements specify the interconnections between NODEs. By connecting the 'from' and 'to' NODE names, the net topology to be depicted in FIGS. 4–7 is enforced by the wiring rule.

Figure 5:
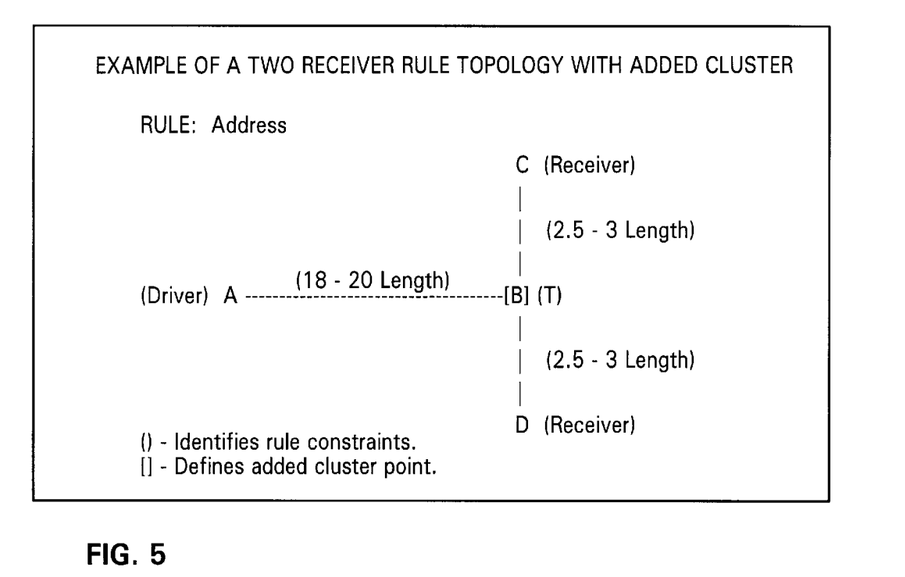
Figure 6:
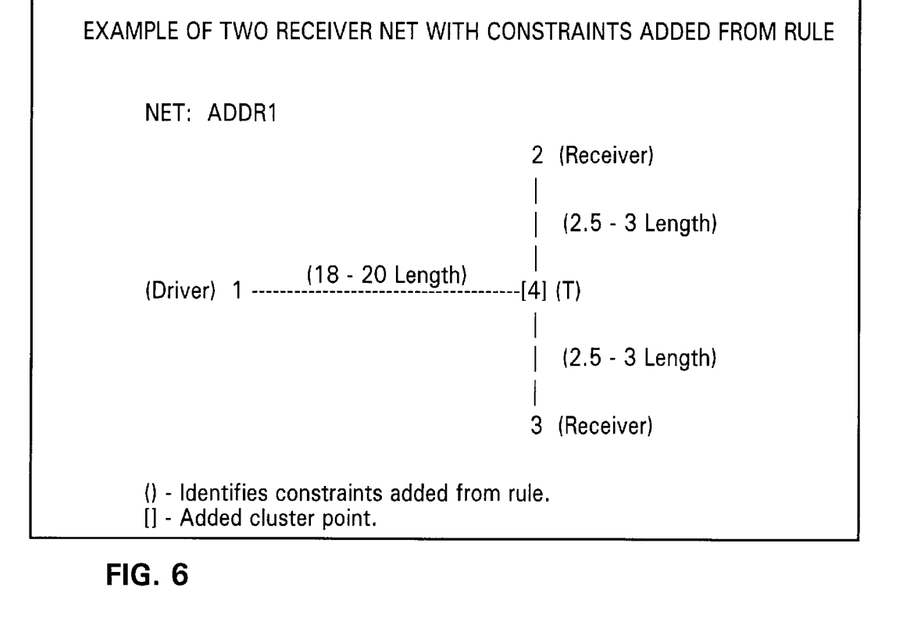

FIG. 5 depicts the topology specified by the wiring rule shown in FIG. 4. The rule constraints are referenced using parenthesis '( )', whereas the added cluster point are shown using a bracket '[ ]'. More specifically, the '18–20 length' shown in the figure was obtained by conducting an independent electrical analysis, which also defines the constrains imposed on the wire length between the driver node and the added cluster point T.
Ordering (FIG. 6)

Ordering is the process of first creating a correlation between the physical pins in the net and the pin models in the net rule and the assigning from-to associativity to the pins in the net to map them to the topology defined by the rule.

Unordered implies neither of the above correlation exist.

After matching the nets to the wiring rules and assigning net topology and constraints (i.e., net ordering), Net ADDR_1 when matched to RULE Address, will have the following constraints and cluster point added: 1) the topology and constraints from the RULE that were asserted to the net; 2) the ordering process matching net node 1 to RULE node A, net node 2 to RULE node C, and net node 3 to RULE node D and 3) adding Cluster point [4] or (T) to the net based on RULE node B. The constraints defined in the RULE such as '18–20', '2.5–3', etc., are also applied to the net as added constraints to the router.
Routing (FIG. 7)

Figure 7:
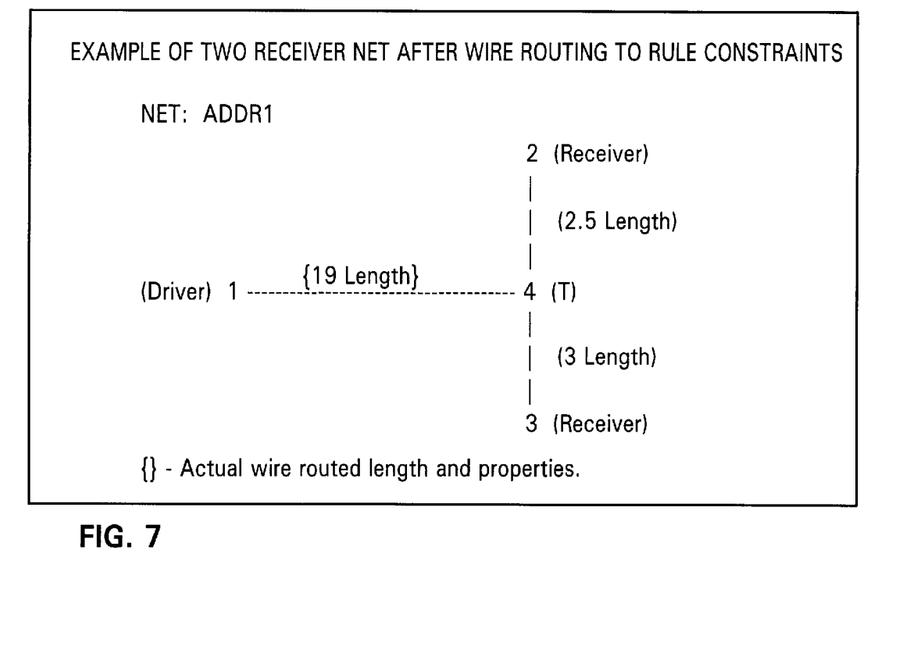

The Net ADDR_1 is now routed. The added cluster point and net constraints force the router to provide the required net routing. Upon completing this routing phase, the net displays the following results: the added cluster point [4] and wire length 2.5, 3 and 19, all of which meet the corresponding constraints imposed by the wiring rules.
Checking Upon completion of the routing step, the nets forming the design are again matched to the rules to verify the correctness of the design. Resulting routed net topology, segment, and node characteristics are checked. Checking verifies that the cluster node was added, that the constraints which locate the cluster node were met, and that any other constraints defined in the assigned wiring rule were, likewise, also met.
Process Steps of Adding a Cluster The ADD CLUSTER PROCESS FLOW section describes the process of matching the net to the 'Add Cluster' wiring rule and annotating the design with the added node and the associated wiring constraints.

The example of the Trace Structure (FIG. 3) illustrates details of the data structure relationships associated with the flows and the net example previous described.

Figure 8:
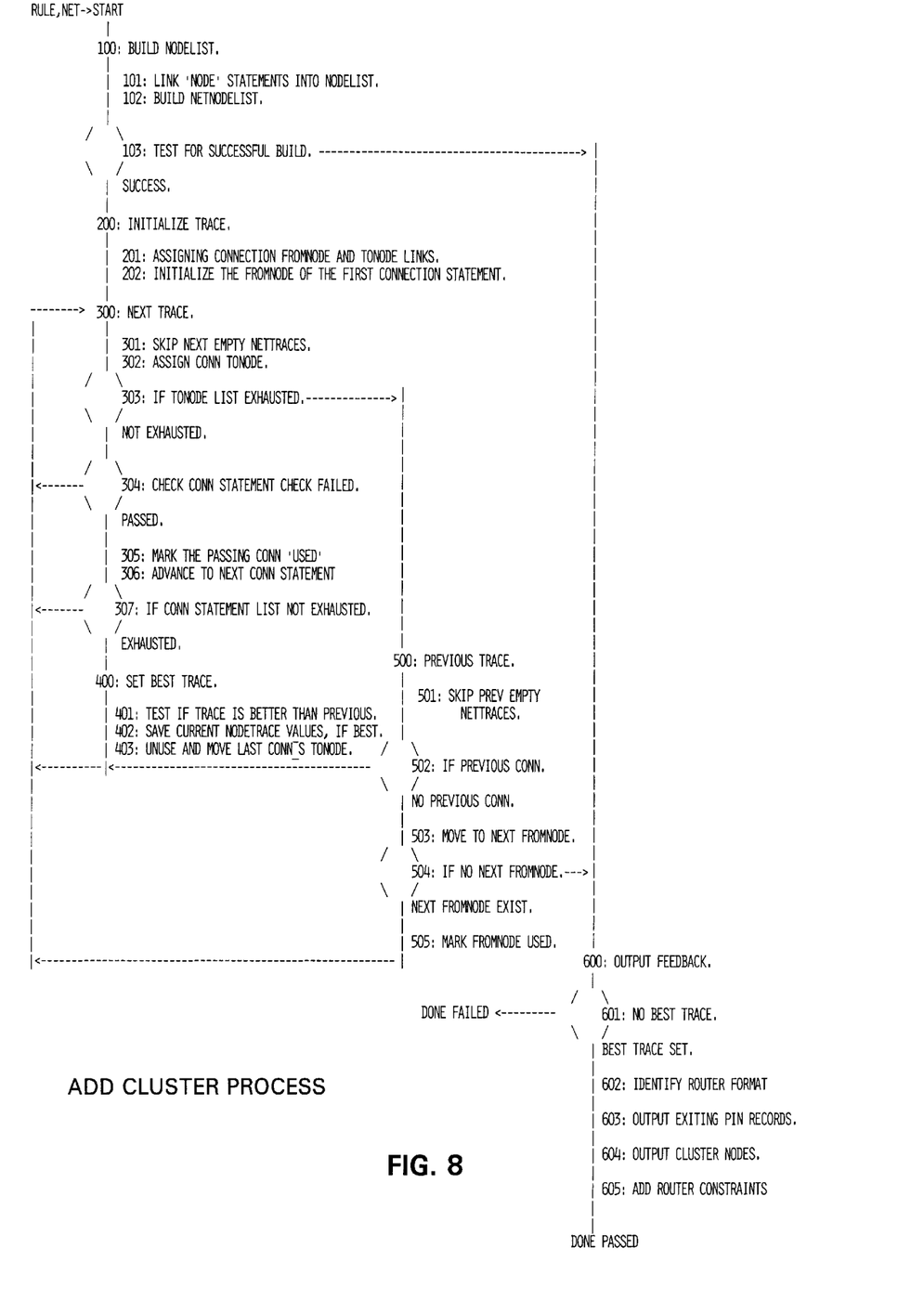
FIG. 8 shows a flow-chart illustrating the steps that embody the 'Add Cluster' process, in accordance with the preferred embodiment of the present invention.

Referring now to ADD CLUSTER PROCESS FLOW of FIG. 8, and keeping in mind the Trace Structure of FIG. 3, are shown the sequence of steps that define the present process, in accordance with the present invention.

There are two distinct types of nodes. Net nodes are physical entities within the physical hardware. Rule nodes are logical models of physical nodes that reside only within net wiring rules.

Accordingly, Net Node List is a list of physical net nodes which are defined above. Rule Node List is a list of logical rule nodes, as defined above.

Steps 100–103 of the flow chart builds the NodeList structure based on the rule NODE statement constraints and the net node properties. The rule NODE statements are linked to form a NodeList (step 101). Then, to each NODE of the NodeList, each node of the net is qualifies prior to its incorporation in the NetNodeList (step 102). While building the NetNodeList from each NODE structure, all possible net nodes which are valid for that position are listed. The NODE structures in the NodeList are then audited (step 103) to determine if a successful trace can be made. The audit consists of identifying that each NODE has at least one NetNodeLink, or that the NODE without any links is for an Add Cluster type node (type T).

The Add Cluster NODE statements without NetNodeLists maintain positions for the cluster point to be subsequently inserted in the net (step 604). If a rule NODE statement is not an 'Add Cluster' node point and the NetNodeList is empty, then there are no net nodes which qualify to the NODE statement of the rule, and no rule-to-net match is possible.

If the NodeList building steps indicate a potential for a successful trace, step 201 continues on to link the CONN statements to the NODE statements. This linking establishes the net topology from the wiring rule, such that a successful trace ordering will match the topology of the rule. The ConnList becomes the primary list manipulated to complete the net tracing. In preparation for tracing, from the head (i.e., the first) CONN statement (from A to B), the 'from' NODE (A) is initialized to the first NetNodeLink (D1). When a NetNodeLink is assigned to a NODE, the net node which has been 'unused' is then renamed as 'used'. Each NetNodeLink points to a single occurrence of the NetNode such that marking a NetNode as 'used' identifies the NetNode in all common NetNodeLinks. This prevents a NetNode from being assigned as the current NetNodeLink to more than one NODE statement.

While tracing the net steps 300–307, the current ConnList pointer is directed initially from the head (i.e., the first) CONN to the last CONN by successive successful assignments of a current NetNodeLink to each of the CONN statements 'to' NODE. If the CONN statements 'from' or 'to' NODE statement has no NetNodeLinks as in an 'Add Cluster' node, the current ConnList CONN statement pointer is advanced to the next CONN (step 301). The tracing involves moving to the next CONN as the 'to' Node NetNodeLinks are assigned (step 302). Once a 'to' Node is assigned, the constraints defined for the connection (such as a minimum and a maximum length) are tested against the properties of the net (step 304). If the tests are successful and additional CONN statements are present, the assigning of the CONN 'to' node NetNodeLinks continues. When the CONN test fails, the next 'unused to' Node assignment is attempted by looping again to the next trace (step 301).

During tracing, if the end of a NetNodeList is reached while attempting to assign a 'to' Node to a NODE statement, a previous trace is attempted (step 500). If there are previous CONN statements to the current one, then the previous one becomes the current one, and the next trace is attempted. If no previous CONN are present, then the next 'from' Node is assigned to the head CONN (step 505) and tracing continues.

A successful trace is indicated (step 307) when the end of the ConnList is reached. With each successful trace, a test is made to qualify the best trace (step 400). All possible traces are deemed traced when the NetNodeList of the head CONN 'from' node NetNodeList is exhausted.

The best trace (step 400) weighs the current trace results against the previous best trace results. If the current trace is better than the previous, or if it is the first trace, then the current trace 'to' Node and 'from' Node assignments are saved for later recording.

When tracing is exhausted and a best trace is found (step 600), the design net list is updated. This update adds the cluster point, defines the wiring topology, and imposes the wiring routing constraints on the net based on the wiring rule specification. The cluster node is added to the net definition in the net list. The net topology is defined as a series of connection 'from' and 'to' node pair definitions for the router to follow. Finally the location of the cluster is constrained by propagating the CONN statements connection constrains (such as min and max length) to the defined connections.

The following coding depicts a list of commands to update the design netlist. This list corresponds to the addition of an added cluster point with the desired constraints and topology defined by the electrical designer in the wiring rule in FIGS. 1a–1b and 2.

```
//   Command     Type       to Net.
     AddNode     Cluster1 to net.
//   Command     From - To, Assigned constraints, . . . to Net.
     DefineConn  D1 - Cluster1, min_length=Jmin, max_length=Jmax
                 to Net.
     DefineConn  Cluster1 - R1, min_length=Kmin, max_length=Kmax
                 to Net.
     DefineConn  Cluster1 - R2, min_length=Kmin, max_length=Kmax
                 to Net.
     DefineConn  Cluster1 - R3, min_length=Kmin, max_length=Kmax
                 to Net.
//
//   Where:
//   Jmin, Jmax, Kmin, and Kmax represent the actual length numeric
     values.
//   Net represents the net identifier (or the name).
//   D1, R1,R2,R3 are existing nodes (or pins) in the net.
//   Cluster1 is the added node to net.
```

Hereinafter, are shown the sequence of steps that form the flow chart shown in FIG. 8.

100: Build NodeList based on Rule NODE statements.

101: The rule NODE statements are linked together in a list forming the NodeList.

102: Assign qualified NetNodeLinks to each NODE statement. The attributes of each node of the net are tested against the constraints defined by the rule NODE statements. A passing result is returned from the constraints test indicates that the net node qualifies as a candidate for the rule's NODE position. A NetNodeLink element is then added to the NetNodeList identifying the net node. All the qualified NetNodeLink elements assigned to a particular NodeTrace are linked together to form a NetNodeList.

103: Test the NodeList elements to determine that each NODE statement has at least one NetNodeLink element in its NetNodeList, or that any empty NodeTrace elements correspond to rule NODE statements which defines an add cluster node. If not true, the trace cannot be successful, then continue with 600 Done (failed). Else continue with 200 Initialize Trace.

200: Initialize Trace.

201: Assign linkage between the FromNode and ToNode nodes of each of the rule CONN statements to each of the corresponding NODE statements in the NodeList.

202: Initialize the first rule CONN statement FromNode's NODE statement to select the first NetNodeLink element in the corresponding NetNodeList. Mark the assigned NetNodeLink's net node as 'used'.

203: Continue with 300, Next Trace.

300: Next Trace:

301: Skip empty NetTraceList where add cluster pins are defined. While either ToNode or FromNode NetTraceList is empty then next CONN statement.

302: Assign the CONN statement ToNode to the first/next unused NetNodeLink element in the corresponding NetNodeList.

303: If the ToNode list is exhausted continue with 500 Previous Trace.

304: Check the attributes of connection defined by the current FromNode and ToNode nodes of the net against the constraints defined by the rule CONN statement. If the check rule CONN statement fails then continue with 300 Next Trace.

305: Mark the passing connection ToNode NetNodeLink as 'used'.

306: Advance to next rule CONN statement, and continue with 300 Next Trace.

307: If rule CONN statement list is exhausted continue with 400 Set Best Trace.** Note that whenever marking a NetNodeLink 'used' or 'unused', all NetNodeLinks sharing the same net node are also marked 'used' or 'unused'.

400: Set Best Trace:

401: As each trace is made a running total of a specific property is maintained. This property is chosen to indicate the quality of the trace. In wire connection tracing this is usually the total net length.

402: If this current total is better then the previous total, save the current NetNode values in each of the NODE statement elements as the Best Trace Data.

403: Perform another trace; 'unused' the last rule 'CONN' statement's ToNode NetNodeLink, move the NODE statement's NetNodeList pointer to the next NetNodeLink and continue with 300 NextTrace to attempt another trace.

500: Previous Trace:

501: Skip empty NetTraceList where add cluster pins are defined. While ToNode or FromNode NetTraceList is empty then previous CONN statement.

502: If a previous rule CONN statement is available, 'unused' the current ToNode NetNodeLink, set the current rule CONN statement pointer to the previous rule CONN statement and continue with 300 Next Trace.

503: 'Unused' the NetNodeLink assigned to the current rule CONN FromNode and move to the next NetNodeLink.

504: If current CONN statement's FromNode NetNodeList is exhausted then continue with 600 DONE, successful trace.

505: Mark the CONN statement's FromNode NetNodeLink as 'used'.

506: Continue with 300, Next Trace.

600: Done, Output feedback file to drive router.

601: If Best Trace Data has been saved, then a passing trace exist, continue to 602, otherwise the trace was unsuccessful.

602: Process each rule connection record. Output the trace result in the proper format to support the router being used.

603: If NetNodeList exist for the CONN statements FromNode or ToNode, list the attributes, such as pin number and component name.

604: If a best NetNodeList does not exist for the CONN statement FromNode or ToNode as in the case for a add cluster node, use the proper syntax to defining the add cluster node such as T or T1 instead of the pin number and component name.

605: Min/Max length restrictions are also added to the feedback file to force the routed wire length between the from and to nodes.

The above described flow chart is integral to a computer program product, falling under the category of design automation program products. These products, which include programs used for wiring integrated circuits within a chip or between chips in one or more packages, are commonly used by practitioners to design integrated circuit chips and packages automatically.

Practitioners of the art will fully appreciate that such program products may be implemented with a program storage device readable by machine, e.g., a computer, which tangibly embodies a program of instructions executable by the machine, e.g., a computer, to perform the method steps for wiring a plurality of integrated circuits within a chip or between chips in one or more packages and which are embodied in the various steps as recited in the appended claims defining in combination the method of the invention.

It will be appreciated by one of ordinary skill in the art that application of these inventive techniques will produce more reliable, and specification compliant electronic circuits and systems, with fewer errors and iterations that might otherwise be possible.

What is claimed is:

1. A method of wiring a plurality of integrated circuits within a chip or between chips in one or more packages by adding cluster points to a net comprising a plurality of nodes to be interconnected while ensuring that the interconnected nodes meet system requirements that include physical, electrical and noise constraints, wherein the system requirements are expressed by wiring rules, the method comprising the steps of:

a) building a trace structure comprising:
      i) a plurality of rule nodes, each of the rule nodes comprising at least one rule node constraint;
      ii) a plurality of net node lists associated with the rule nodes, each of the net node lists comprising net nodes having first attributes that meet the rule node constraints; and
      iii) a plurality of rule connections, each of the rule connections comprising connection constraints to be imposed on a pair of the rule nodes;
   b) successively linking each of the rule nodes to each of the rule connections until all the rule nodes have been linked, thereby forming the net; and
   c) matching the rule connection constraints to second attributes associated with the pair of rules nodes, wherein:
      when the matching is successful, the rule connection constraints are imposed on the pair of rule nodes;
      when the matching is successful and the net node list of at least one pair of the rule nodes is empty, at least one cluster point is added to the net; and
      when the matching is unsuccessful, the connection between the linked rule nodes is flagged as violating the wiring rules.

2. The method as recited in claim 1, wherein each of the rule connections includes from-to constraints and min-max constraints.

3. The method as recited in claim 1, wherein the first attributes are selected from the group consisting of drivers, receivers, IO types, component names and component functions.

4. The method as recited in claim 1, wherein the second attributes include a wiring interconnection length and/or a wiring interconnection delay.

5. The method as recited in step c) of claim 1, further comprising the steps of:
   d) selecting a first one of the rule connections and assigning a 'from' attribute to the first net node in the net node list and characterizing as used the net node having the assigned 'from' attribute;
   e) assigning a 'to' node to a first unused net node in the net node list to form a potential interconnection, wherein
      i) if the assignment is successful by finding the unused net node, the potential interconnection is validated, and the 'to' node of a next one of the rule connections is allocated to the first unused net node in the net node list;
      ii) if the unused net node in the net node list is not found, the assignment is deemed unsuccessful, and another 'to' node is selected out of a previous one of the rule connections;
      iii) if the assignment is successful, step i) is repeated until an end of a rule connection list comprising ordered rule connections is reached; and
      iv) if the unused net node in the net node list is not found while at the beginning of the rule connection list, then another net node is selected.

6. The method as recited in step i) of claim 5, wherein the validation of the potential interconnection is based on an estimated routed wire attribute or an actual routed wire attribute.

7. The method as recited in steps i) and ii) of claim 5, further comprising the steps of:
   recording a failure of the validation when no previous rule connection in the rule connection list is available; and
   recording a success of the validation when a next rule connection in the rule connection list is not available; and
   adding at least a cluster point and constraints to the validated net when success is recorded.

8. The method as recited in claim 7, wherein no cluster point is added to the validated net in the event that no cluster point is defined by the wiring rules.

9. A method of wiring a plurality of integrated circuits within a chip or between chips in one or more packages by adding cluster points to a net comprising a plurality of nodes to be interconnected while ensuring that the interconnected nodes meet system requirements that include physical, electrical and noise constraints, wherein the system requirements are expressed by wiring rules, the method comprising the steps of:
   a) designing the integrated circuit chip or package;
   b) building a trace structure comprising:
      i) a plurality of rule nodes, each of the rule nodes comprising at least one rule node constraint;
      ii) a plurality of net node lists associated with the rule nodes, each of the net node lists comprising net nodes having first attributes that meet the rule node constraints; and
      iii) a plurality of rule connections, each of the rule connections comprising rule connection constraints to be imposed on a pair of the rule nodes;
   c) successively linking each of the rule nodes to each of the rule connections until the rule nodes have all been linked, thereby forming the net; and
   d) matching the rule connection constraints to second attributes associated with the pair of rule nodes, wherein:
      when the matching is successful, the rule connection constraints are imposed on the pair of rule nodes;
      when the matching is successful and the net node list of at least one pair of the rule nodes is empty, then at least one cluster point is added to the net; and
      when the matching is unsuccessful, the interconnection between the linked rule nodes is flagged as violating the wiring rules; and
   e) fabricating the integrated circuit chip or package having the added cluster points and the interconnection constraints to each of the nets that were successfully matched as determined in the prior steps.

10. The method as recited in step d) of claim 9, further comprising the steps of:
    a) selecting a first one of the rule connections and assigning a 'from' attribute to the first net node in the net node list and flagging the net node having the assigned 'from' attribute as used;
    b) assigning a 'to' node to a first unused net node in the net node list, thereby forming a potential interconnection;
       i) if the unused net node in the net list is found, thereby making the assignment successful, the potential interconnection is validated, and the 'to' node of a next one of the rule connections is allocated to the first unused net node in the net node list;
       ii) if the unused net node in the net node list is not found, thereby making the assignment unsuccessful, then another 'to' node is selected out of a previous one of the rule connections;
       iii) if the assignment is successful, then step i) is repeated until an end of the rule connections is reached; and
       iv) if the unused net node in the net node list is not found while at the beginning of the rule connections, then another net node from the rule connection is selected.

11. A system for wiring integrated circuits within a chip or between chips in one or more packages by adding cluster points to a net comprising a plurality of nodes to be interconnected while ensuring that the interconnected nodes meet system requirements that include physical, electrical and noise constraints, wherein the system requirements are expressed by wiring rules, the system comprising:
    a) means for building a trace structure comprising:
       i) a plurality of rule nodes, each of the rule nodes comprising at least one rule node constraint;
       ii) a plurality of net node lists associated with the rule nodes, each of the net node lists comprising net nodes having first attributes that meet the rule node constraints; and
       iii) a plurality of rule connections, each of the rule connections comprising rule connection constraints to be imposed on a pair of the rule nodes;
    b) means for successively linking each of the net rule nodes to each of the rule connections until all the rule nodes have been linked, thereby forming the net; and
    c) means for matching the rule connection constraints to second attributes associated with the pair of rule nodes, wherein:
       when the matching is successful, the rule connection constraints are imposed on the pair of rule nodes;
       when the matching is successful and the net node list of at least one pair of the rule nodes is empty, at least one cluster point is added to the net; and
       when the matching is unsuccessful, the connection between the linked rule nodes is flagged as violating wiring the rules.

12. The system as recited in claim 11, wherein each of the rule connections includes from-to constraints and min-max constraints.

13. The system as recited in claim 11, wherein the first attributes are selected from the group consisting of drivers, receivers, IO types, component names and component functions.

14. The system as recited in claim 11, wherein the second attributes include a wiring interconnection length and/or a wiring interconnection delay.

15. The means for matching as recited in claim 11, further comprising:
  d) means for selecting a first one of the rule connections and means for assigning a 'from' attribute to the first net node in the net node list and characterizing as used the net node having the assigned 'from' attribute;
  e) means for assigning a 'to' node to a first unused net node in the net node list, thereby forming a potential interconnection, wherein
    i) if the assignment is successful by finding the unused net node, the potential interconnection is validated, and the 'to' node of a next one of the rule connections is allocated to the first unused net node in the net node list;
    ii) if the unused net node in the net node list is not found, the assignment is deemed unsuccessful, and another 'to' node is selected out of a previous one of the rule connections;
    iii) if the assignment is successful, step i) is repeated until an end of the rule connection is reached; and
    iv) if the unused net node in the net node list is not found while at the beginning of the rule connections, then another net node from the rule connections is selected.

16. The system as recited in claim 15, wherein the means for validating the potential interconnection includes an estimated routed wire attribute or an actual routed wire attribute.

17. The system as recited in claim 15, further comprising:
  means for recording a failure of the validation when no previous rule connection in the rule connection list is available; and
  means for recording a success of the validation when a next rule connection in the rule connection list is not available; and
  means for adding at least a cluster point and constraints to the validated net when success is recorded.

18. The system as recited in claim 17, wherein no cluster point is added to the validated net in the event that no cluster point is defined by the wiring rules.

19. A program storage device readable by a machine, tangibly embodying a program of instructions executable by the machine to perform method steps for wiring a plurality of integrated circuits within a chip or between chips in one or more packages by adding cluster points to a net comprising a plurality of nodes to be interconnected while ensuring that the interconnected nodes meet system requirements that include physical, electrical and noise constraints, wherein the system requirements are expressed by wiring rules, the method comprising the steps of:
  a) building a trace structure comprising:
    i) a plurality of rule nodes, each of the rule nodes comprising at least one rule node constraint;
    ii) a plurality of net node lists associated with rule nodes, each of the net node lists comprising net nodes having first attributes that meet the rule node constraints; and
    iii) a plurality of rule connections, each of the rule connections comprising rule connection constraints to be imposed on a pair of the rule nodes;
  b) successively linking each of the rule nodes to each of the rule connections until all the rule nodes have been linked; and
  c) matching the rule connection constraints to second attributes associated with the pair of rule nodes, wherein:
    when the matching is successful, the rule connection constraints are imposed on the pair of rule nodes;
    when the matching is successful and the net node list of at least one pair of the rule nodes is empty, then at least one cluster point is added to the net; and
    when the matching is unsuccessful, the connection between the linked rule nodes is flagged as violating the wiring rules.

20. A computer program product for wiring integrated circuits within a chip or between chips in one or more packages by adding cluster points to a net comprising a plurality of nodes to be interconnected while ensuring that the interconnected nodes meet system requirements that include physical, electrical and noise constraints, wherein the system requirements are expressed by wiring rules, the computer program product comprising:
  a) a computer usable medium having computer readable program code means embodied therein for a causing a computer to effect a means for building a trace structure comprising:
    i) a plurality of rule nodes, each of the rule nodes comprising of at least one rule node constraint;
    ii) a plurality of net node lists associated with the rule nodes, each of the net node lists comprising net nodes having first attributes that meet the rule node constraints; and
    iii) a plurality of rule connections, each of the rule connections comprising rule connection constraints to be imposed on a pair of the rule nodes;
  b) a computer usable medium having computer readable program code means embodied therein for a causing a computer to effect a means for successively linking each of the net rule nodes to each of the rule connections until all the rule nodes have been linked; and
  c) a computer usable medium having computer readable program code means embodied therein for a causing a computer to effect a means for matching the rule connection constraints to second attributes associated with the pair of linked rule nodes, wherein:
    when the matching is successful, the rule connections constraints are imposed on the pair of linked rule nodes;
    when the matching is successful and the net node list of at least one of the pairs of the linked rule nodes is empty, at least one cluster point is added to the net; and
    when the matching is unsuccessful, the connection between the linked rule nodes is flagged as violating wiring the rules.

* * * * *